United States Patent
Hu (10) Patent No.: US 10,121,900 B2
(45) Date of Patent: Nov. 6, 2018

(54) THIN-FILM TRANSISTOR, LIQUID CRYSTAL DISPLAY PANEL, AND THIN-FILM TRANSISTOR MANUFACTURING METHOD

(71) Applicant: Shenzhen China Star Optoelectronics Technology Co., Ltd., Shenzhen, Guangdong (CN)

(72) Inventor: Xiaobo Hu, Guangdong (CN)

(73) Assignee: Shenzhen China Star Optoelectronics Technology Co., Ltd, Shenzhen (CN)

( * ) Notice: Subject to any disclaimer, the term of this patent is extended or adjusted under 35 U.S.C. 154(b) by 151 days.

(21) Appl. No.: 15/100,402

(22) PCT Filed: Mar. 31, 2016

(86) PCT No.: PCT/CN2016/077952
§ 371 (c)(1),
(2) Date: May 31, 2016

(87) PCT Pub. No.: WO2017/152442
PCT Pub. Date: Sep. 14, 2017

(65) Prior Publication Data
US 2018/0097117 A1  Apr. 5, 2018

(30) Foreign Application Priority Data
Mar. 11, 2016 (CN) .......................... 2016 1 0141481

(51) Int. Cl.
*H01L 29/786* (2006.01)
*H01L 21/42* (2006.01)
(Continued)

(52) U.S. Cl.
CPC ...... *H01L 29/78618* (2013.01); *G02F 1/1368* (2013.01); *H01L 21/42* (2013.01);
(Continued)

(58) Field of Classification Search
CPC .......... H01L 27/1222; H01L 29/78618; H01L 29/78696; H01L 29/66969; H01L 29/7869;
(Continued)

(56) References Cited

U.S. PATENT DOCUMENTS 7,576,394 B2 * 8/2009 Furuta ............... H01L 29/41733
257/347
2009/0242881 A1 * 10/2009 Yoon ................... H01L 27/1225
257/43
(Continued)

FOREIGN PATENT DOCUMENTS

CN          1912725 A    2/2007
CN        101726947 A    6/2010
(Continued)

*Primary Examiner* — Mohsen Ahmadi
*Assistant Examiner* — Gustavo Ramallo
(74) *Attorney, Agent, or Firm* — Andrew C. Cheng (57) ABSTRACT

A thin-film transistor, a liquid crystal display panel, and a thin-film transistor manufacturing method are provided. The thin-film transistor includes a base plate and a gate electrode, a gate insulation layer, a source electrode, a drain electrode, a channel layer, first and second ohmic contact layers, a passivation layer, and a pixel electrode that are arranged on the same side of the base plate. The gate insulation layer covers the gate electrode that is on the base plate. The source electrode, the drain electrode, the channel layer, the first and second ohmic contact layers are arranged on the gate insulation layer. The channel layer is arranged between the source electrode and the drain electrode and corresponds to the gate electrode. The first ohmic contact layer is arranged between the source electrode and the channel layer. The second ohmic contact layer is arranged between the drain electrode and the channel layer.

12 Claims, 3 Drawing Sheets

(51) Int. Cl.
*H01L 29/423* (2006.01)
*G02F 1/1368* (2006.01)
*H01L 29/66* (2006.01)

(52) U.S. Cl.
CPC ...... *H01L 29/423* (2013.01); *H01L 29/66969* (2013.01); *H01L 29/7869* (2013.01); *H01L 29/78696* (2013.01)

(58) Field of Classification Search
CPC .............. H01L 21/42; H01L 29/78675; H01L 29/78633; H01L 29/66757; H01L 27/1248; H01L 27/124; H01L 27/1262; H01L 27/127
See application file for complete search history.

(56) References Cited

U.S. PATENT DOCUMENTS

| | | | |
|---|---|---|---|
| 2010/0025680 A1* | 2/2010 | Shino | H01L 29/7869 257/43 |
| 2014/0048806 A1 | 2/2014 | Price | |
| 2015/0129870 A1 | 5/2015 | Hsin et al. | |
| 2016/0190171 A1* | 6/2016 | Wang | H01L 27/1222 257/72 |

FOREIGN PATENT DOCUMENTS

| | | |
|---|---|---|
| CN | 103460391 A | 12/2013 |
| CN | 104600080 A | 5/2015 |
| CN | 104904019 A | 9/2015 |
| JP | 2010-191107 | 9/2010 |
| JP | 2011192679 A | 9/2011 |
| JP | 2014-029976 A | 2/2014 |

\* cited by examiner

THIN-FILM TRANSISTOR, LIQUID CRYSTAL DISPLAY PANEL, AND THIN-FILM TRANSISTOR MANUFACTURING METHOD

CROSS REFERENCE TO RELATED APPLICATIONS

This application claims the priority of Chinese Patent Application No. 201610141481.7, "Thin-Film Transistor, Liquid Crystal Display Panel, and Thin-Film Transistor Manufacturing Method", filed on Mar. 11, 2016, the disclosure of which is incorporated herein by reference in its entirety.

BACKGROUND OF THE INVENTION

1. Field of the Invention

The present invention relates to the field of display, and more particularly to a thin-film transistor, a liquid crystal display panel, and a thin-film transistor manufacturing method.

2. The Related Arts

Liquid crystal display devices, such as a liquid crystal display (LCD), are a commonly used electronic device, which possesses advantages including low power consumption, reduced size, and light weight, and have widely attracted the attention of users. A liquid crystal display generally comprises an array substrate. The array substrate comprises a plurality of thin-film transistors (TFTs) arranged in an array. The quality of the TFTs directly affects the quality of a liquid crystal display panel. A conventional thin-film transistor comprises a channel layer that is direct contact engagement with a source electrode and a drain electrode so that the contact impedance between the channel layer and the source is relatively great and the contact impedance between the channel layer and the drain electrode is also relatively great, whereby the liquid crystal display requires a relatively large drive voltage and has an enlarged power consumption.

SUMMARY OF THE INVENTION

The present invention provides a thin-film transistor, which comprises a base plate and a gate electrode, a gate insulation layer, a source electrode, a drain electrode, a channel layer, a first ohmic contact layer, a second ohmic contact layer, a passivation layer, and a pixel electrode that are arranged on the same side of the base plate. The gate electrode is arranged on a surface of the base plate and the gate insulation layer covers the gate electrode. The source electrode, the drain electrode, the channel layer, the first ohmic contact layer, and the second ohmic contact layer are arranged on the gate insulation layer. The source electrode and the drain electrode are spaced from each other. The channel layer is arranged between the source electrode and the drain electrode, and the channel layer is arranged to correspond to the gate electrode. The first ohmic contact layer is arranged between the source electrode and the channel layer. Two opposite ends of the first ohmic contact layer re respectively in contact engagement with an end of the source electrode that faces the channel layer and an end of the channel layer that faces the source electrode. The first ohmic contact layer functions to reduce contact resistance between the source electrode and the channel layer. The second ohmic contact layer is arranged between the drain electrode and the channel layer. Two opposite ends of the second ohmic contact layer are respectively in contact engagement with an end of the drain electrode that faces the channel layer and an end of the channel layer that faces the drain electrode. The second ohmic contact layer functions to reduce contact resistance between the drain electrode and the channel layer. The first ohmic contact layer, the second ohmic contact layer, and the channel layer are on the same layer. The channel layer is a metal oxide layer. The passivation layer covers the channel layer, the source electrode, the drain electrode, the first ohmic contact layer, and the second ohmic contact layer. The passivation layer is formed with a via corresponding to the drain electrode. The pixel electrode is arranged on the passivation layer and connected, through the via, to the drain electrode.

In the above thin-film transistor, the gate electrode comprises a first lateral face and a second lateral face opposite to each other. The first lateral face and the second lateral face both intersect the base plate. The first lateral face is arranged closer to the source electrode than the second lateral face. The first lateral face is coplanar with an end of the channel layer that faces the source electrode. The second lateral face is coplanar with an end of the channel layer that faces the drain electrode.

In the above thin-film transistor, the channel layer comprises indium gallium zinc oxide (IGZO).

In the above thin-film transistor, the gate insulation layer comprises a first sub gate insulation layer and a second sub gate insulation layer. The first sub gate insulation layer is set on and covers the gate electrode. The second sub gate insulation layer is set on and covers the first sub gate insulation layer. The first sub gate insulation layer comprises a silicon nitride material. The second sub gate insulation layer comprises a silicon oxide material.

The present invention provides a thin-film transistor that comprises a first ohmic contact layer arranged between a source electrode and a channel layer so as to reduce the contact resistance between the source electrode and the channel layer; and correspondingly, the thin-film transistor of the present invention comprises a second ohmic contact layer arranged between a drain electrode and the channel layer so as to reduce the contact resistance between the drain electrode and the channel layer. Consequently, the power consumption required by the thin-film transistor of the present invention is reduced.

The present invention also provides a liquid crystal display panel, which comprises the above-described thin-film transistor.

The present invention further provides a thin-film transistor manufacturing method, which comprises:

providing a base plate, wherein the base plate comprises a first surface and a second surface that are opposite to each other;

forming a gate electrode on the first surface, wherein the gate electrode comprises a first lateral face and a second lateral face and the first lateral face and the second lateral face both intersect the base plate;

forming a gate insulation layer covering the gate electrode;

forming a source electrode and a drain electrode that are arranged on the gate insulation layer such that a gap is formed between the source electrode and the drain electrode, wherein a distance from an end of the source electrode that faces the drain electrode to the second lateral surface is greater than a distance from the first lateral surface to the second lateral surface, and a distance from an end of the drain electrode that faces the source electrode to the first lateral surface is greater than a distance from the second lateral surface to the first lateral surface;

forming a first ohmic contact layer, a second ohmic contact layer, and a channel layer that are on the same layer in the gap, wherein the first ohmic contact layer is arranged between the source electrode and the channel layer and two opposite ends of the first ohmic contact layer are respectively in contact engagement with the source electrode and an end of the channel layer that faces the source electrode; and the second ohmic contact layer is arranged between the drain electrode and the channel layer and two opposite ends of the second ohmic contact layer are respectively in contact engagement with the drain electrode and an end of the channel layer that faces the drain electrode, wherein the channel layer comprises a metal oxide layer;

forming a passivation layer to cover the channel layer, the source electrode, the drain electrode, the first ohmic contact layer, and the second ohmic contact layer;

forming a via in the passivation layer to correspond to the drain electrode; and forming a pixel electrode that is arranged on the passivation layer and is connected, through the via, to the drain electrode.

In the above thin-film transistor manufacturing method, "forming a first ohmic contact layer, a second ohmic contact layer, and a channel layer that are on the same layer in the gap" comprises:

forming a metal oxide material layer in the gap and in contact engagement with an end of the source electrode that faces the drain electrode and an end of the drain electrode that faces the source electrode; and irradiating ultraviolet light on the second surface for a predetermined period of time, wherein a portion of the metal oxide layer that is in contact engagement with the source electrode and irradiated with the ultraviolet light forms a first ohmic contact layer and a portion of the metal oxide material layer that is in contact engagement with the drain electrode and irradiated with the ultraviolet light forms a second ohmic contact layer, while a portion of the metal oxide material layer that is not irradiated with the ultraviolet light forms a channel layer.

In the above thin-film transistor manufacturing method, the ultraviolet light has a wavelength of 150-300 nm and the predetermined period of time of irradiation is 2 hours to 4 hours.

In the above thin-film transistor manufacturing method, when the second surface is irradiated with ultraviolet light, the ultraviolet light so irradiated perpendicular to the second surface.

In the above thin-film transistor manufacturing method, "forming a gate insulation layer covering the gate electrode" comprises:

forming a first sub insulation layer set on and covering the gate electrode, wherein the first sub insulation layer 131 comprises a silicon nitride material; and.

forming a second sub insulation layer set on and covering the first sub insulation layer, wherein the second sub insulation layer comprises a silicon oxide material.

BRIEF DESCRIPTION OF THE DRAWINGS

To more clearly explain the technical solution proposed in an embodiment of the present invention and that of the prior art, a brief description of the drawings that are necessary for describing embodiments is given as follows. It is obvious that the drawings that will be described below show only some embodiments. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to a technical solution of embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
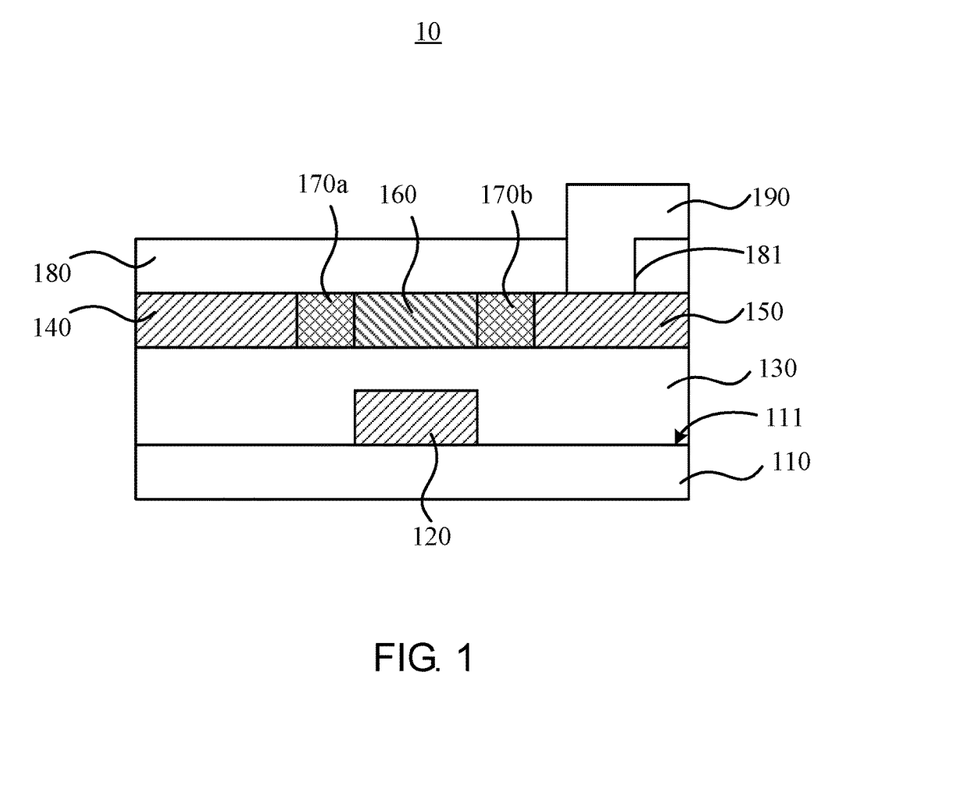
FIG. 1 is a cross-sectional view illustrating the structure of a thin-film transistor according to a preferred embodiment of the present invention.

Referring to FIG. 1, FIG. 1 is a cross-sectional view showing a thin-film transistor according to a preferred embodiment of the present invention. The thin-film transistor 10 comprises a base plate 110 and a gate electrode 120, a gate insulation layer 130, a source electrode 140, a drain electrode 150, a channel layer 160, a first ohmic contact layer 170a, a second ohmic contact layer 170b, a passivation layer 180, and a pixel electrode 190 that are arranged on the same side of the base plate 110. The gate electrode 120 is arranged on a surface of the base plate 110 and the gate insulation layer 130 covers the gate electrode 120. The source electrode 140, the drain electrode 150, the channel layer 160, the first ohmic contact layer 170a, and the second ohmic contact layer 170b are arranged on the gate insulation layer 130. The source electrode 140 and the drain electrode 150 are spaced from each other; the channel layer 160 is arranged between the source electrode 140 and the drain electrode 150 and the channel layer 60 is arranged to correspond to the gate electrode 120. The first ohmic contact layer 170a is arranged between the source electrode 140 and the channel layer 160 and two opposite ends of the first ohmic contact layer 170a are respectively in contact engagement with an end of the source electrode 140 that faces the channel layer 160 and an end of the channel layer 160 that faces the source electrode 140. The first ohmic contact layer 170a functions to reduce contact resistance between the source electrode 140 and the channel layer 160. The second ohmic contact layer 170b is arranged between the drain electrode 150 and the channel layer 160 and two opposite ends of the second ohmic contact layer 170b are respectively in contact engagement with an end of the drain electrode 150 that faces the channel layer 160 and an end of the channel layer 160 that faces the drain electrode 150. The second ohmic contact layer 170b functions to reduce contact resistance between the drain electrode 150 and the channel layer 160. The first ohmic contact layer 170a, the second ohmic contact layer 170b, and the channel layer 160 are on the same layer. The channel layer 160 is a metal oxide layer. The passivation layer 180 covers the channel layer 160, the source electrode 140, the drain electrode 150, the first ohmic contact layer 170a, and the second ohmic contact layer 170b. The passivation layer 180 is formed with a via 181 corresponding to the drain electrode 150. The pixel electrode 190 is arranged on the passivation layer 180 and is connected, through the via 181, to the drain electrode 150.

The gate electrode 120 comprises a first lateral face 121 and a second lateral face 122 opposite to each other. The first lateral face 121 and the second lateral face 122 both intersect the base plate 110. The first lateral face 121 is arranged closer to the source electrode 140 than the second lateral face 122. The first lateral face 121 is coplanar with an end of the channel layer 160 that faces the source electrode 140; and the second lateral face 122 is coplanar with an end of the channel layer 160 that faces the drain electrode 150.

Due to the first lateral face 121 of the gate electrode 120 being coplanar with the end of the channel layer 160 that faces the source electrode 140 and the second lateral face 122 of the gate electrode 120 being coplanar with the end of the channel layer 160 that faces the drain electrode 150, there is no insulation medium sidewall existing between the gate electrode 120 and the source electrode 140 and there is also insulation medium sidewall existing between the gate electrode 120 and the drain electrode 150 and thus, parasitic resistance that is potentially present in the channel layer 160 of the thin-film transistor 10 can be suppressed. Further, due to the first lateral face 121 of the gate electrode 120 being coplanar with the end of the channel layer 160 that faces the source electrode 140 and the second lateral face 122 of the gate electrode 120 being coplanar with the end of the channel layer 160 that faces the drain electrode 150, there is no overlapping between the gate electrode 120 and the source electrode 140 and there is also no overlapping between the gate electrode 120 and the drain electrode 150 and thus, parasitic capacitance between the gate electrode 120 and the source electrode 140 is reduced and parasitic capacitance between the gate electrode 120 and the drain electrode 150 is reduced.

Further, in the present invention, the gate electrode 120, the source electrode 140, and the drain electrode 150 of the thin-film transistor 10 can be made thicker, but not significantly increasing the parasitic capacitance between the gate electrode 120 and the source electrode 140 and the parasitic capacitance between the gate electrode 120 and the drain electrode 150. The thicker gate electrode 120, the thicker source electrode 140, and the thicker drain electrode 150 help reduce the electrical resistance of these electrode themselves and also suppress parasitic resistance induced in these electrodes. Preferably, the gate electrode 120 has a thickness that is 1500-6000 Å; the source electrode 140 has a thickness that is 2000-5000 Å; and the drain electrode 150 has a thickness that is 2000-5000 Å.

In the instant embodiment, the base plate 110 is an insulation backing having light transmittance that is greater than predetermined light transmittance for ultraviolet light. The predetermined light transmittance can be, but not limited to, 90%. The base plate 110 is made of a material that comprises one or multiple ones of electrical insulation materials including quartz, mica, aluminum oxide, and transparent plastics. The base plate 110 being an insulation backing helps reduce high frequency loss of the base plate 110.

The gate electrode 120 blocks ultraviolet light that transmits through the base plate 110 so that the ultraviolet light that transmits through the base plate 110 is prevented from transmitting through the gate electrode 120. It is appreciated that when the ultraviolet light that transmits through the base plate 110 is allowed to transmit the gate electrode 120 with light transmittance thereof being less than a preset threshold level (such as 5%), it is also considered that the ultraviolet light that passes through the base plate 110 does not transmit through the gate electrode 120. The gate electrode 120 is made of a material comprising, but not limited to, one or multiple ones of metallic materials including molybdenum (Mo), aluminum/copper (Al/Cu) composite material. The gate electrode 120 has a thickness that is 1500-6000 Å.

In the instant embodiment, the gate insulation layer 130 comprises a first sub gate insulation layer 131 and a second sub gate insulation layer 132. The first sub gate insulation layer 131 is set on and covers the gate electrode 120, and the second sub gate insulation layer 132 is set on and covers the first sub gate insulation layer 131. The first sub gate insulation layer 131 comprises a silicon nitride (SiNx) material; and the second sub gate insulation layer 132 comprises a silicon oxide (SiOx) material. The first sub gate insulation layer 131 that comprises a silicon nitride material may generate, during the manufacture of the silicon nitride material, hydrogen (H) element that can be used to repair the channel layer 160 so as to improve electrical properties of the channel layer 160. The second sub gate insulation layer 132 helps improve stresses induced in the channel layer 160, the source electrode 140, the drain electrode 150, the first ohmic contact layer 170a, and the second ohmic contact layer 170b to prevent detachment of the channel layer 160, the source electrode 140, the drain electrode 150, the first ohmic contact layer 170a, and the second ohmic contact layer 170b. The gate insulation layer 130 may have a thickness that is 1500-4000 Å.

Materials that make the source electrode 140 and the drain electrode 150 may comprise, but not limited to, aluminum/molybdenum (Al/Mo) composite material. The source electrode 140 and the drain electrode 150 may have thicknesses that are 2000-5000 Å.

In an embodiment, the channel layer 160 has a thickness that is 300-1000 Å. The channel layer may comprise, but not limited to, indium gallium zinc oxide (IGZO).

The passivation layer 180 has a thickness that is 1500-4000 Å. The passivation layer 180 may comprise, but not limited to, a silicon nitride (SiNx) material, a silicon oxide (SiOx) material, or a composite layer of a silicon oxide material and a silicon nitride material. When the passivation layer 180 is formed as a composite layer comprising a silicon oxide material and a silicon nitride material, for easy reference, the silicon oxide material layer will be referred to as a first sub passivation layer, while the silicon nitride material layer will be referred to as a second sub passivation layer. The first sub passivation layer is set on and covers the source electrode 140, the drain electrode 150, the channel layer 160, the first ohmic contact layer 170a, and the second ohmic contact layer 170b, and the second sub passivation layer is set on and covers the first sub passivation layer.

The pixel electrode 190 has a thickness that is 300-1000 Å. The pixel electrode 190 may comprise, but not limited to, indium tin oxide (ITO).

Compared to the prior art, the present invention provides a thin-film transistor that comprises a first ohmic contact layer 170a arranged between a source electrode 140 and a channel layer 160 so as to reduce the contact resistance between the source electrode 140 and the channel layer 160; and correspondingly, the thin-film transistor 10 of the present invention comprises a second ohmic contact layer 170b arranged between a drain electrode 150 and the channel layer 160 so as to reduce the contact resistance between the drain electrode 150 and the channel layer 160. Consequently, the power consumption required by the thin-film transistor 10 of the present invention is reduced.

Figure 2:
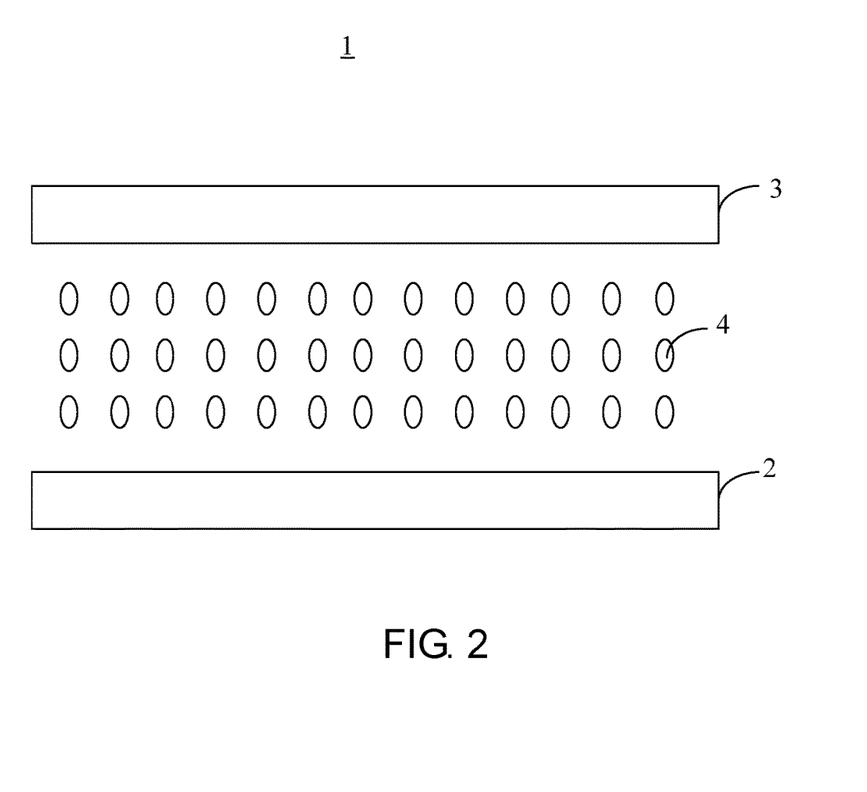
FIG. 2 is a schematic view illustrating the structure of a liquid crystal display panel according to a preferred embodiment of the present invention.

The present invention also provides a liquid crystal display panel. Referring to FIG. 2, FIG. 2 is a schematic view illustrating a liquid crystal display panel according to a preferred embodiment of the present invention. The liquid crystal display panel 1 according to the present invention comprises an array substrate 2, a color filter substrate 3, and a liquid crystal layer 4. The array substrate 2 and the color filter substrate 3 are arranged opposite to and spaced from each other. The liquid crystal layer 4 is sandwiched between the array substrate 2 and the color filter substrate 3. The array substrate 2 comprises a plurality of thin-film transistors 10 arranged in an array. Details of the thin-film transistors 10 may be referred to the description given above and repeated description will be omitted here.

Figure 3:
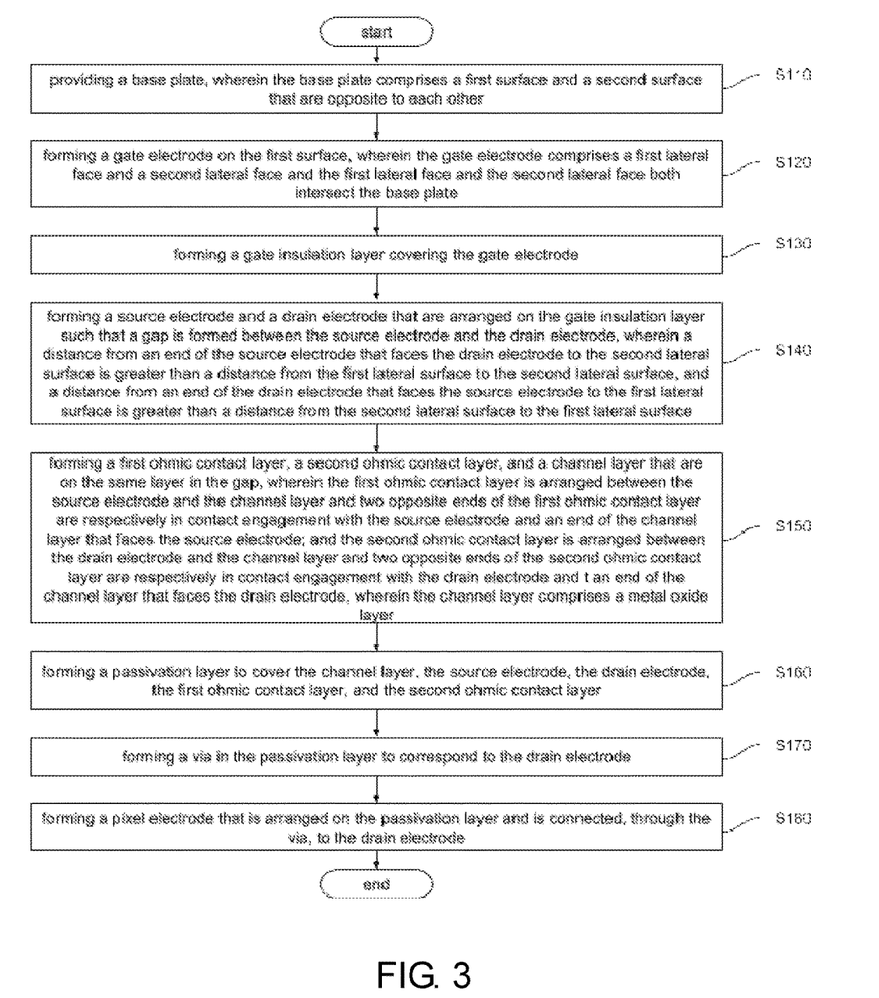
FIG. 3 is a flow chart illustrating a thin-film transistor manufacturing method according to a preferred embodiment of the present invention.

In the following, a description will be given, with reference to FIG. 1 and the description provided associated with FIG. 1, for illustrating a thin-film transistor manufacture method according to the present invention. Reference being also had to FIG. 3, FIG. 3 is a flow chart illustrating a thin-film transistor manufacture method according to a preferred embodiment of the present invention. The thin-film transistor manufacture method comprises, but not limited to, the following steps.

Step S110: providing a base plate 110, wherein the base plate 110 comprises a first surface 111 and a second surface 112 that are opposite to each other.

Step S120: forming a gate electrode 120 on the first surface 111, wherein the gate electrode 120 comprises a first lateral face 121 and a second lateral face 122 and the first lateral face 121 and the second lateral face 122 both intersect the base plate 110. Specifically, the gate electrode 120 is formed as follows. Firstly, a first metal layer is formed on the entirety of the first surface 111 of the base plate 110. The first metal layer may comprise, but not limited to, molybdenum (Mo), aluminum/copper (Al/Cu) composite material. The first metal layer is formed through physical vapor deposition (PVD). The gate electrode 120 has a thickness that is 1500-6000 Å. Then, the first metal layer is patterned to form the gate electrode 120. Patterning the first metal layer may be achieved by using a mask plate to conduct exposure, development, etching, and peeling.

Step S130: forming a gate insulation layer 130 covering the gate electrode 120. The gate insulation layer 130 may be formed by depositing a layer of an insulation material having a film thickness of 1500-4000 Å through plasma enhanced chemical vapor deposition (PECVD).

Preferably, step S130 comprises the following sub-steps:

Step S131: forming a first sub insulation layer 131 set on and covering the gate electrode 120, wherein the first sub insulation layer 131 comprises a silicon nitride material.

Step S132: forming a second sub insulation layer 132 set on and covering the first sub insulation layer 131, wherein the second sub insulation layer 132 comprises a silicon oxide material.

Step S140: forming a source electrode 140 and a drain electrode 150 that are arranged on the gate insulation layer 130 such that a gap is formed between the source electrode 140 and the drain electrode 150, wherein a distance from an end of the source electrode 140 that faces the drain electrode 150 to the second lateral surface 122 is greater than a distance from the first lateral surface 121 to the second lateral surface 122, and a distance from an end of the drain electrode 150 that faces the source electrode 140 to the first lateral surface 121 is greater than a distance from the second lateral surface 122 to the first lateral surface 121.

The source electrode 140 and the drain electrode 150 can be formed as follows. A second metal layer is formed on the entirety of a surface of the gate insulation layer 130. The second metal layer comprises, but not limited to, aluminum/molybdenum (Al/Mo) composite material. The second metal layer can be formed with PVD. The second metal layer has a thickness that is 2000-5000 Å. Next, the second metal layer is patterned to form the source electrode 140 and the drain zone 150. Patterning the second metal layer may be achieved by using a mask plate to conduct exposure, development, etching, and peeling.

Step S150: forming a first ohmic contact layer 170a, a second ohmic contact layer 170b, and a channel layer 160 that are on the same layer in the gap, wherein the first ohmic contact layer 170a is arranged between the source electrode 140 and the channel layer 160 and two opposite ends of the first ohmic contact layer 170a are respectively in contact engagement with the source electrode 140 and an end of the channel layer 160 that faces the source electrode 140; and the second ohmic contact layer 170b is arranged between the drain electrode 150 and the channel layer 160 and two opposite ends of the second ohmic contact layer 170b are respectively in contact engagement with the drain electrode 150 and an end of the channel layer 160 that faces the drain electrode 150, wherein the channel layer 160 comprises a metal oxide layer.

Specifically, Step S150 comprises the following sub-steps:

Step S151: forming a metal oxide material layer in the gap and in contact engagement with an end of the source electrode 140 that faces the drain electrode 150 and an end of the drain electrode 150 that faces the source electrode 140.

Step S152: irradiating ultraviolet light on the second surface 112 for a predetermined period of time, wherein a portion of the metal oxide layer that is in contact engagement with the source electrode 140 and irradiated with the ultraviolet light forms a first ohmic contact layer 170a and a portion of the metal oxide material layer that is in contact engagement with the drain electrode 150 and irradiated with the ultraviolet light forms a second ohmic contact layer 170b, while a portion of the metal oxide material layer that is not irradiated with the ultraviolet light forms a channel layer 160. Preferably, ultraviolet light used has a wavelength of 150-300 nm, and the predetermined period of time is 2 hours to 4 hours. Preferably, when the second surface 112 is irradiated with ultraviolet light, the ultraviolet light so irradiated perpendicular to the second surface 112.

Tests reveal that the metal oxide material layer would exhibit significant variation in respect of electrical property thereof with irradiation of ultraviolet light for different periods of time and mobility and carrier concentration may get increased with extension of irradiation time of ultraviolet light, meaning excellent electrical conductivity is obtained. Taking the metal oxide material layer being IGZO as an example, tests indicate for a period of four (4) hours of irradiation of ultraviolet light, a portion of the metal oxide material layer that is so irradiated shows resistivity of $4.6*10^{-3}$, hall mobility being 14.6 cm$^2$/V, and carrier concentration being $1.6*10^{12}$ cm$^2$, and with an aging test lasting for a given period of time (which is four weeks in this example), the metal oxide material layer so irradiated with ultraviolet light shows barely no variation in respect of electrical conductivity, mobility, and carrier concentration.

Step S160: forming a passivation layer 180 to cover the channel layer 160, the source electrode 140, the drain electrode 150, the first ohmic contact layer 170a, and the second ohmic contact layer 170b. Specifically, the passivation layer 180 can be formed by depositing a layer of insulation material having a film thickness of 15000-4000 Å through PECVD. The insulation material may comprise, but not limited to, a silicon nitride (SiNx) material, a silicon oxide (SiOx) material, or a composite layer of a silicon oxide material and a silicon nitride material.

Step S170: forming a via 181 in the passivation layer 180 to correspond to the drain electrode 150. The via 181 can be formed through a photolithographic operation and an etching operation.

Step S180: forming a pixel electrode 190 that is arranged on the passivation layer 180 and is connected, through the via 181, to the drain electrode 150. Specifically, the pixel electrode 190 can be formed by depositing a layer of a transparent conductive material through PVD. The transparent conductive material has a thickness that is 300-1000 Å and then, a photolithographic operation and an etching operation may be used to form the pixel electrode 190.

Compared to the prior art, the present invention provides a thin-film transistor manufacture method that comprises forming a first ohmic contact layer 170a arranged between a source electrode 140 and a channel layer 160 so as to reduce the contact resistance between the source electrode 140 and the channel layer 160; and correspondingly, the thin-film transistor manufacturing method of the present invention comprises forming a second ohmic contact layer 170b arranged between a drain electrode 150 and the channel layer 160 so as to reduce the contact resistance between the drain electrode 150 and the channel layer 160. Consequently, the power consumption required by a thin-film transistor 10 manufactured with the thin-film transistor manufacturing method of the present invention is reduced.

Further, since the metal oxide material layer is very sensitive to acid, and the metal oxide material layer may be quickly corroded by even weak acids. Manufacturing the source electrode 140 and the drain electrode 150 uses acids (a metal etchant solution) and thus, according to the present invention, the thin-film transistor manufacturing method first forms the source electrode 140 and the drain electrode 150 on the gate insulation layer 130 and then forming the metal oxide material layer that is used to form the first ohmic contact layer 170a, the second ohmic contact layer 170b, and the channel layer 160 in the gap between the source electrode 140 and the drain electrode 150 to prevent the metal etchant solution used in manufacturing the source electrode 140 and the drain electrode 150 from affecting the metal oxide material layer.

A preferred embodiment has been disclosed above to describe the present invention and it is not intended to limit the scope of the present invention. Those skilled in the art would appreciate that the entire or a part of the flow descried in the above embodiment, and equivalent variation made according to the claims of the present invention, are considered belonging to the scope of protection covered by the present invention.

What is claimed is:

1. A thin-film transistor, comprising a base plate and a gate electrode, a gate insulation layer, a source electrode, a drain electrode, a channel layer, a first ohmic contact layer, a second ohmic contact layer, a passivation layer, and a pixel electrode that are arranged on the same side of the base plate, the gate electrode being arranged on a surface of the base plate and the gate insulation layer covering the gate electrode, the source electrode, the drain electrode, the channel layer, the first ohmic contact layer, and the second ohmic contact layer being arranged on the gate insulation layer, the source electrode and the drain electrode being spaced from each other; the channel layer being arranged between the source electrode and the drain electrode, the channel layer being arranged to correspond to the gate electrode, the first ohmic contact layer being arranged between the source electrode and the channel layer, two opposite ends of the first ohmic contact layer being respectively in contact engagement with an end of the source electrode that faces the channel layer and an end of the channel layer that faces the source electrode, the first ohmic contact layer functioning to reduce contact resistance between the source electrode and the channel layer, the second ohmic contact layer being arranged between the drain electrode and the channel layer, two opposite ends of the second ohmic contact layer being respectively in contact engagement with an end of the drain electrode that faces the channel layer and an end of the channel layer that faces the drain electrode, the second ohmic contact layer functioning to reduce contact resistance between the drain electrode and the channel layer, the first ohmic contact layer, the second ohmic contact layer, and the channel layer being on the same layer, the channel layer being a metal oxide layer, the passivation layer covering the channel layer, the source electrode, the drain electrode, the first ohmic contact layer, and the second ohmic contact layer, the passivation layer being formed with a via corresponding to the drain electrode, the pixel electrode being arranged on the passivation layer and connected, through the via, to the drain electrode;

wherein the gate electrode comprises a first lateral face and a second lateral face opposite to each other, the first lateral face and the second lateral face both intersecting the base plate, the first lateral face being arranged closer to the source electrode than the second lateral face, the first lateral face being coplanar with an end of the channel layer that faces the source electrode, the second lateral face being coplanar with an end of the channel layer that faces the drain electrode.

2. The thin-film transistor as claimed in claim 1, wherein the channel layer comprises indium gallium zinc oxide (IGZO).

3. The thin-film transistor as claimed in claim 1, wherein the gate insulation layer comprises a first sub gate insulation layer and a second sub gate insulation layer, the first sub gate insulation layer being set on and covering the gate electrode, the second sub gate insulation layer being set on and covering the first sub gate insulation layer, the first sub gate insulation layer comprising a silicon nitride material, the second sub gate insulation layer comprising a silicon oxide material.

4. A liquid crystal display panel, comprising a thin-film transistor as claimed in claim 1.

5. A thin-film transistor manufacturing method, comprising:

providing a base plate, wherein the base plate comprises a first surface and a second surface that are opposite to each other;

forming a gate electrode on the first surface, wherein the gate electrode comprises a first lateral face and a second lateral face and the first lateral face and the second lateral face both intersect the base plate;

forming a gate insulation layer covering the gate electrode;

forming a source electrode and a drain electrode that are arranged on the gate insulation layer such that a gap is formed between the source electrode and the drain electrode, wherein a distance from an end of the source electrode that faces the drain electrode to the second lateral surface is greater than a distance from the first lateral surface to the second lateral surface, and a distance from an end of the drain electrode that faces the source electrode to the first lateral surface is greater than a distance from the second lateral surface to the first lateral surface;

forming a first ohmic contact layer, a second ohmic contact layer, and a channel layer that are on the same layer in the gap, wherein the first ohmic contact layer is arranged between the source electrode and the channel layer and two opposite ends of the first ohmic contact layer are respectively in contact engagement with the source electrode and an end of the channel layer that faces the source electrode; and the second ohmic contact layer is arranged between the drain electrode and the channel layer and two opposite ends of the second ohmic contact layer are respectively in contact engagement with the drain electrode and an end of the channel layer that faces the drain electrode, wherein the channel layer comprises a metal oxide layer;

forming a passivation layer to cover the channel layer, the source electrode, the drain electrode, the first ohmic contact layer, and the second ohmic contact layer;

forming a via in the passivation layer to correspond to the drain electrode; and forming a pixel electrode that is arranged on the passivation layer and is connected, through the via, to the drain electrode.

6. The thin-film transistor manufacturing method as claimed in claim 5, wherein "forming a first ohmic contact layer, a second ohmic contact layer, and a channel layer that are on the same layer in the gap" comprises:

forming a metal oxide material layer in the gap and in contact engagement with an end of the source electrode that faces the drain electrode and an end of the drain electrode that faces the source electrode; and irradiating ultraviolet light on the second surface for a predetermined period of time, wherein a portion of the metal oxide layer that is in contact engagement with the source electrode and irradiated with the ultraviolet light forms a first ohmic contact layer and a portion of the metal oxide material layer that is in contact engagement with the drain electrode and irradiated with the ultraviolet light forms a second ohmic contact layer, while a portion of the metal oxide material layer that is not irradiated with the ultraviolet light forms a channel layer.

7. The thin-film transistor manufacturing method as claimed in claim 6, wherein the ultraviolet light has a wavelength of 150-300 nm and the predetermined period of time of irradiation is 2 hours to 4 hours.

8. The thin-film transistor manufacturing method as claimed in claim 6, wherein when the second surface is irradiated with ultraviolet light, the ultraviolet light so irradiated perpendicular to the second surface.

9. The thin-film transistor manufacturing method as claimed in claim 5, wherein "forming a gate insulation layer covering the gate electrode" comprises:

forming a first sub insulation layer set on and covering the gate electrode, wherein the first sub insulation layer comprises a silicon nitride material; and forming a second sub insulation layer set on and covering the first sub insulation layer, wherein the second sub insulation layer comprises a silicon oxide material.

10. A thin-film transistor, comprising a base plate and a gate electrode, a gate insulation layer, a source electrode, a drain electrode, a channel layer, a first ohmic contact layer, a second ohmic contact layer, a passivation layer, and a pixel electrode that are arranged on the same side of the base plate, the gate electrode being arranged on a surface of the base plate and the gate insulation layer covering the gate electrode, the source electrode, the drain electrode, the channel layer, the first ohmic contact layer, and the second ohmic contact layer being arranged on the gate insulation layer, the source electrode and the drain electrode being spaced from each other; the channel layer being arranged between the source electrode and the drain electrode, the channel layer being arranged to correspond to the gate electrode, the first ohmic contact layer being arranged between the source electrode and the channel layer, two opposite ends of the first ohmic contact layer being respectively in contact engagement with an end of the source electrode that faces the channel layer and an end of the channel layer that faces the source electrode, the first ohmic contact layer functioning to reduce contact resistance between the source electrode and the channel layer, the second ohmic contact layer being arranged between the drain electrode and the channel layer, two opposite ends of the second ohmic contact layer being respectively in contact engagement with an end of the drain electrode that faces the channel layer and an end of the channel layer that faces the drain electrode, the second ohmic contact layer functioning to reduce contact resistance between the drain electrode and the channel layer, the first ohmic contact layer, the second ohmic contact layer, and the channel layer being on the same layer, the channel layer being a metal oxide layer, the passivation layer covering the channel layer, the source electrode, the drain electrode, the first ohmic contact layer, and the second ohmic contact layer, the passivation layer being formed with a via corresponding to the drain electrode, the pixel electrode being arranged on the passivation layer and connected, through the via, to the drain electrode;

wherein the gate insulation layer comprises a first sub gate insulation layer and a second sub gate insulation layer, the first sub gate insulation layer being set on and covering the gate electrode, the second sub gate insulation layer being set on and covering the first sub gate insulation layer, the first sub gate insulation layer comprising a silicon nitride material, the second sub gate insulation layer comprising a silicon oxide material.

11. The thin-film transistor as claimed in claim 10, wherein the channel layer comprises indium gallium zinc oxide (IGZO).

12. A liquid crystal display panel, comprising a thin-film transistor as claimed in claim 10.

* * * * *